United States Patent
Ngo

(10) Patent No.: US 8,350,360 B1
(45) Date of Patent: Jan. 8, 2013

(54) FOUR-TERMINAL CARBON NANOTUBE CAPACITORS

(75) Inventor: Quoc X. Ngo, Sterling, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 155 days.

(21) Appl. No.: 12/869,539

(22) Filed: Aug. 26, 2010

Related U.S. Application Data

(60) Provisional application No. 61/238,070, filed on Aug. 28, 2009.

(51) Int. Cl.
*H01L 21/02* (2006.01)

(52) U.S. Cl. ......... 257/532; 977/700; 977/938; 977/953

(58) Field of Classification Search .................. 257/532; 977/700, 938, 953
See application file for complete search history.

(56) References Cited

U.S. PATENT DOCUMENTS

| | | | |
|---|---|---|---|
| 6,440,763 B1 | 8/2002 | Hsu | |
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,784,028 B2 | 8/2004 | Rueckes et al. | |
| 6,835,591 B2 | 12/2004 | Rueckes et al. | |
| 6,911,682 B2 | 6/2005 | Rueckes et al. | |
| 6,919,592 B2 | 7/2005 | Segal et al. | |
| 6,924,538 B2 | 8/2005 | Jaiprakash et al. | |
| 6,930,343 B2 | 8/2005 | Choi et al. | |
| 6,990,009 B2 | 1/2006 | Bertin et al. | |
| 7,115,901 B2 | 10/2006 | Bertin et al. | |
| 7,115,960 B2 | 10/2006 | Bertin et al. | |
| 7,211,844 B2 | 5/2007 | Furukawa et al. | |
| 7,259,410 B2 | 8/2007 | Jaiprakash et al. | |
| 7,335,395 B2 | 2/2008 | Ward et al. | |
| 7,365,632 B2 | 4/2008 | Bertin et al. | |
| 7,479,654 B2 | 1/2009 | Bertin et al. | |
| 7,560,136 B2 | 7/2009 | Ward et al. | |

(Continued)

FOREIGN PATENT DOCUMENTS

WO  WO 2009/108175  9/2009

OTHER PUBLICATIONS

G. Zhang et al., "Hydrogenation and Hydrocarbonation and Etching of Single-Walled Carbon Nanotubes," J. Am. Chem. SOC, 2006, pp. 6026-6027 and S1-S3, vol. 128, No. 18, American Chemical Society.

(Continued)

*Primary Examiner* — Tan N Tran
(74) *Attorney, Agent, or Firm* — McDermott Will & Emery LLP

(57) ABSTRACT

A carbon nanotube (CNT) capacitor includes a CNT film and four terminals. The first terminal includes a first end electrode disposed at a first end of the CNT film. The second terminal includes a second end electrode disposed at a second end of the CNT film. The third terminal includes an upper electrode disposed above the CNT film. The fourth terminal includes a lower electrode disposed below the CNT film. A method of operating a CNT capacitor includes applying a first signal across the first and second terminals to switch a CNT film from a conductive state to a non-conductive state, and applying a second signal across the third and fourth terminals to store charge or to discharge charges in the CNT capacitor. A method of making a CNT capacitor includes providing four terminals and a CNT film.

4 Claims, 8 Drawing Sheets

U.S. PATENT DOCUMENTS

| | | | |
|---|---|---|---|
| 7,564,269 B2 | 7/2009 | Bertin | |
| 7,566,478 B2 | 7/2009 | Ward et al. | |
| 7,623,340 B1 | 11/2009 | Song et al. | |
| 7,667,999 B2 | 2/2010 | Herner et al. | |
| 7,820,502 B2 | 10/2010 | Furukawa et al. | |
| 7,852,612 B2 | 12/2010 | Zhao | |
| 7,898,045 B2 | 3/2011 | Furukawa et al. | |
| 2003/0211724 A1 | 11/2003 | Haase | |
| 2005/0196950 A1 | 9/2005 | Steinhogl et al. | |
| 2006/0214262 A1 | 9/2006 | Mosley et al. | |
| 2006/0276056 A1 | 12/2006 | Ward et al. | |
| 2006/0292861 A1 | 12/2006 | Furukawa et al. | |
| 2007/0001220 A1 | 1/2007 | Tombler, Jr. et al. | |
| 2007/0040488 A1 | 2/2007 | Watanabe et al. | |
| 2007/0111460 A1 | 5/2007 | Mosley et al. | |
| 2007/0258192 A1 | 11/2007 | Schindall et al. | |
| 2008/0030352 A1 | 2/2008 | Shaw | |
| 2008/0044954 A1 | 2/2008 | Furukawa et al. | |
| 2008/0142866 A1 | 6/2008 | Choi et al. | |
| 2008/0157127 A1 | 7/2008 | Bertin et al. | |
| 2008/0212361 A1 | 9/2008 | Bertin et al. | |
| 2008/0231413 A1 | 9/2008 | Bertin et al. | |
| 2008/0237858 A1 | 10/2008 | Nihei | |
| 2008/0277646 A1 | 11/2008 | Kim et al. | |
| 2009/0068830 A1 | 3/2009 | Suh et al. | |
| 2009/0154218 A1 | 6/2009 | Bertin et al. | |
| 2009/0194839 A1 | 8/2009 | Bertin et al. | |
| 2009/0239439 A1 | 9/2009 | Wei et al. | |
| 2009/0303801 A1 | 12/2009 | Kim | |
| 2009/0309456 A1 | 12/2009 | Stollberg | |
| 2010/0001267 A1 | 1/2010 | Manning et al. | |
| 2010/0005645 A1 | 1/2010 | Bertin et al. | |
| 2010/0072459 A1 | 3/2010 | Bertin et al. | |
| 2010/0149895 A1 | 6/2010 | Kim | |
| 2010/0195261 A1 | 8/2010 | Sweeney et al. | |
| 2010/0224998 A1 | 9/2010 | Duvall et al. | |
| 2010/0259867 A1 | 10/2010 | Machida et al. | |
| 2011/0073827 A1 | 3/2011 | Rubloff et al. | |
| 2011/0081770 A1 | 4/2011 | Tombler, Jr. | |
| 2011/0149372 A1 | 6/2011 | Liu et al. | |
| 2011/0158894 A1 | 6/2011 | Lee | |
| 2011/0187240 A1 | 8/2011 | Hsu et al. | |
| 2011/0214264 A1 | 9/2011 | Hsu et al. | |

OTHER PUBLICATIONS

X. Ho et al., "Scaling Properties in Transistors That Use Aligned Arrays of Single-Walled Carbon Nanotubes," Nano Letters, 2010, pp. 499-503, 10, American Chemical Society.

A. Hassanien et al., "Selective Etching of Metallic Single-Wall Carbon Nanotubes with Hydrogen Plasma," Nanotechnology, 2005, pp. 278-281, 16, Institute of Physics Publishing Ltd.

K. Ahmad et al., "Electrical Conductivity and Dielectric Properties of Multiwalled Carbon Nanotube and Alumina Composites," Applied Physics Letters, 2006, pp. 133122-1 through 133122-3, vol. 89, American Institute of Physics.

Rainer Waser, "Nanoelectronics and Information Technology: Advanced Electronic Materials and Novel Devices," 2005, p. 543, Wiley-VCH.

100
FOUR-TERMINAL CARBON NANOTUBE CAPACITORS

CROSS-REFERENCES TO RELATED APPLICATIONS

The present application claims the benefit of priority under 35 U.S.C. §119 from U.S. Provisional Patent Application Ser. No. 61/238,070, entitled "Method for Building High-Density, Low-Leakage On-Chip Metal-Insulator-Metal Capacitors (MIMCAP) Using Insulating Carbon Nanotubes," filed on Aug. 28, 2009, which is hereby incorporated by reference in its entirety for all purposes.

STATEMENT REGARDING FEDERALLY SPONSORED RESEARCH OR DEVELOPMENT

Not applicable.

FIELD

The subject technology relates in general to nanotubes and devices, and more particularly to, four-terminal carbon nanotube capacitors.

BACKGROUND

Currently, metal-insulator-metal capacitor (MIMCAP) technology scaled for high-density, high-speed applications suffer from large leakage current between conducting terminals in the capacitor. Leakage is driven primarily by scaling the device to ultra-thin dielectrics used to obtain optimal operating speed of the device. Leakage in these devices leads to standby power consumption issues and loss of data storage in the case of random access memory (RAM) applications.

In addition, a unit cell of a readout integrated circuit (ROIC) for infrared (IR) and ultraviolet (UV) detectors require high storage densities coupled with compact layout areas. Leakage inevitably leads to refresh requirements, i.e., restoring capacitor charge to prevent data loss, in dynamic RAM (DRAM) circuits. The development of MIMCAPs with low leakage would therefore be useful. In one aspect, the subject technology satisfies these needs and provides related advantages as well.

SUMMARY

In one aspect, using insulating carbon nanotubes or a randomly arranged carbon nanotube network, the subject technology addresses the requirements of a dielectric layer for use in MIMCAP devices.

In one aspect of the disclosure, a carbon nanotube capacitor may comprise: a carbon nanotube film; a first end electrode disposed at a first end of the carbon nanotube film; a second end electrode disposed at a second end of the carbon nanotube film; an upper electrode disposed above the carbon nanotube film and in a middle region of the carbon nanotube film; and a lower electrode disposed below the carbon nanotube film and in the middle region of the carbon nanotube film. The first end electrode may be different from the second end electrode, the upper electrode and the lower electrode. The second end electrode may be different from the upper electrode and the lower electrode. The upper electrode may be different from the lower electrode. The carbon nanotube capacitor may be a four terminal device comprising four terminals, wherein a first one of the four terminals is the first end electrode, a second one of the four terminals is the second end electrode, a third one of the four terminals is the upper electrode, and the fourth one of the four terminals is the lower electrode.

In one aspect, it is important that a carbon nanotube capacitor has four terminals, each being distinctive from another, wherein two of the terminals are configured to switch the carbon nanotube capacitor from a conductive state to a non-conductive state and the other two terminals are configured to store charge or discharge charges.

In one aspect, the carbon nanotube capacitor further comprises an upper dielectric layer disposed above the carbon nanotube film and below the upper electrode; and a conductive via disposed within the upper dielectric layer, the conductive via connected to the upper electrode and to the carbon nanotube film.

In one aspect, the upper electrode and the lower electrode are separated from each other by a first fixed distance vertically, aligned to each other horizontally, and extend lengthwise in a first direction. In one aspect, the first end electrode and the second end electrode are separated from each other by a second fixed distance horizontally, aligned to each other vertically, and extend lengthwise in the first direction. In one aspect, the carbon nanotube film extends lengthwise horizontally in a second direction different from the first direction.

In one aspect, the carbon nanotube capacitor is an arrayed capacitor. In one aspect, the carbon nanotube capacitor further comprises: a second carbon nanotube film disposed parallel to the carbon nanotube film; and a lower dielectric layer disposed below the carbon nanotube film and the second carbon nanotube film. In one aspect, the first end electrode is disposed at a first end of the second carbon nanotube film, wherein the second end electrode is disposed at a second end of the second carbon nanotube film, wherein the upper electrode is disposed above the second carbon nanotube film and in a middle region of the second carbon nanotube film, wherein the lower electrode is disposed below the second carbon nanotube film and in the middle region of the second carbon nanotube film, wherein the first end electrode is parallel to the second end electrode, wherein the upper electrode is parallel to the lower electrode, wherein the carbon nanotube film is parallel to the second carbon nanotube film, wherein the first and second end electrodes are perpendicular to the carbon nanotube film and the second carbon nanotube film, and wherein the upper and lower electrodes are perpendicular to the carbon nanotube film and the second carbon nanotube film.

In one aspect, the carbon nanotube capacitor further comprises: a substrate disposed below the carbon nanotube film. In a further aspect, the first end electrode comprises an upper first end electrode disposed above the substrate and a lower first end electrode disposed in the substrate, wherein the upper first end electrode and the lower first end electrode are connected, wherein the second end electrode comprises an upper second end electrode disposed above the substrate and a lower second end electrode disposed in the substrate, wherein the upper second end electrode and the lower second end electrode are connected, wherein the substrate comprises a lower dielectric layer disposed below the carbon nanotube film, between the lower first end electrode and the lower electrode, and between the lower second end electrode and the lower electrode, and wherein the lower electrode is disposed within the substrate.

In one aspect, at least a portion of the upper first end electrode is disposed on an upper surface of the carbon nanotube film and is connected to the carbon nanotube film, wherein at least a portion of the upper second end electrode is disposed on the upper surface of the carbon nanotube film and is connected to the carbon nanotube film, wherein at least a portion of the lower first end electrode is disposed below a lower surface of the carbon nanotube film and is connected to the carbon nanotube film, wherein at least a portion of the lower second end electrode is disposed below the lower surface of the carbon nanotube film and is connected to the carbon nanotube film, wherein the first end electrode is physically separated from the second end electrode, wherein the upper electrode is physically separated from the lower electrode, wherein the first end electrode and the second end electrode are physically separated from the upper electrode and the lower electrode, wherein the upper electrode is connected to the upper surface of the carbon nanotube film, and wherein the lower electrode is connected to the lower surface of the carbon nanotube film.

In one aspect, the carbon nanotube capacitor further comprises an upper dielectric layer disposed above the carbon nanotube film and below the upper electrode; a conductive via disposed within the upper dielectric layer, the conductive via connected to the upper electrode and to the carbon nanotube film; and a substrate disposed below the carbon nanotube film, wherein the first end electrode comprises an upper first end electrode disposed above the substrate and a lower first end electrode disposed in the substrate, wherein the upper first end electrode and the lower first end electrode are connected, wherein the second end electrode comprises an upper second end electrode disposed above the substrate and a lower second end electrode disposed in the substrate, wherein the upper second end electrode and the lower second end electrode are connected, wherein the substrate comprises a lower dielectric layer disposed below the carbon nanotube film, between the lower first end electrode and the lower electrode, and between the lower second end electrode and the lower electrode, In a further aspect, at least a portion of the upper first end electrode is disposed on an upper surface of the carbon nanotube film and is connected to the carbon nanotube film, wherein at least a portion of the upper second end electrode is disposed on the upper surface of the carbon nanotube film and is connected to the carbon nanotube film, wherein at least a portion of the lower first end electrode is disposed below a lower surface of the carbon nanotube film and is connected to the carbon nanotube film, wherein at least a portion of the lower second end electrode is disposed below the lower surface of the carbon nanotube film and is connected to the carbon nanotube film, wherein the first end electrode is physically separated from the second end electrode, wherein the upper electrode is physically separated from the lower electrode, wherein the first end electrode and the second end electrode are physically separated from the upper electrode and the lower electrode, In a further aspect, the upper electrode is connected to the upper surface of the carbon nanotube film through the conductive via, wherein the lower electrode is connected to the lower surface of the carbon nanotube film, wherein an upper surface of the upper dielectric layer is connected to a lower surface of the upper electrode, wherein a lower surface of the upper dielectric layer is connected to the upper surface of the carbon nanotube film, wherein a first edge of the upper dielectric layer is connected to a side of the upper first end electrode, wherein a second edge of the upper dielectric layer is connected to a side of the upper second end electrode, wherein an upper surface of the conductive via is connected to the lower surface of the upper electrode, and wherein a lower surface of the conductive via is connected to the upper surface of the carbon nanotube film.

In one aspect, the first end electrode and the second end electrode are configured to apply voltages to switch the carbon nanotube film from a conductive state to a non-conductive state, and wherein the upper electrode is a capacitor anode or a capacitor cathode, and the lower electrode is a capacitor cathode or a capacitor anode, and the upper electrode and the lower electrode are configured to apply voltages to store charges in the carbon nanotube capacitor.

In one aspect, a thickness of the carbon nanotube film is between 1 nm and 1 μm.

In one aspect of the disclosure, a method of operating a carbon nanotube capacitor may comprise: applying a first signal between (i) a first end electrode disposed at a first end of a carbon nanotube film and (ii) a second end electrode disposed at a second end of the carbon nanotube film, to switch the carbon nanotube film from a conductive state to a non-conductive state; and applying a second signal between (iii) an upper electrode disposed above the carbon nanotube film and in a middle region of the carbon nanotube film and (iv) a lower electrode disposed below the carbon nanotube film and in the middle region of the carbon nanotube film, to store charge or to discharge charges in the carbon nanotube capacitor. The first end electrode may be different from the second end electrode, the upper electrode and the lower electrode. The second end electrode may be different from the upper electrode and the lower electrode. The upper electrode may be different from the lower electrode. The carbon nanotube capacitor may be a four terminal device comprising four terminals, wherein a first one of the four terminals is the first end electrode, a second one of the four terminals is the second end electrode, a third one of the four terminals is the upper electrode, and the fourth one of the four terminals is the lower electrode.

In one aspect of the method, the first signal comprises a voltage pulse applied to switch the carbon nanotube film from the conductive state to the non-conductive state, wherein the second signal comprises a voltage applied to store charges in the carbon nanotube capacitor, and wherein the upper electrode is a capacitor anode or a capacitor cathode, and the lower electrode is a capacitor cathode or a capacitor anode.

In one aspect of the disclosure, a method of making a carbon nanotube capacitor may comprise: providing a lower electrode; providing a carbon nanotube film; providing a first end electrode at a first end of the carbon nanotube film; providing a second end electrode at a second end of the carbon nanotube film; providing an upper electrode above the carbon nanotube film and in a middle region of the carbon nanotube film. The lower electrode may be disposed below the carbon nanotube film and in the middle region of the carbon nanotube film. The first end electrode may be different from the second end electrode, the upper electrode and the lower electrode. The second end electrode may be different from the upper electrode and the lower electrode. The upper electrode may be different from the lower electrode.

In one aspect, the method further comprises: providing an upper dielectric layer above the carbon nanotube film and below the upper electrode; and providing a conductive via within the upper dielectric layer, the conductive via connected to the upper electrode and to the carbon nanotube film.

In one aspect of the method, the upper dielectric layer covers the entire upper surface of the carbon nanotube film but not areas of the upper surface of the carbon nanotube film covered by the conductive via, the first end electrode and the second end electrode.

In one aspect of the method, the carbon nanotube capacitor is an arrayed capacitor. In one aspect, the method further comprises: providing a lower dielectric layer, prior to the operation of providing the carbon nanotube film; and providing a second carbon nanotube film parallel to the carbon nanotube film, concurrently with the operation of providing the carbon nanotube film. In one aspect, the lower dielectric layer is disposed below the carbon nanotube film and the second carbon nanotube film, wherein the first end electrode is disposed at a first end of the second carbon nanotube film, wherein the second end electrode is disposed at a second end of the second carbon nanotube film, wherein the upper electrode is disposed above the second carbon nanotube film and in a middle region of the second carbon nanotube film.

In a further aspect, the lower electrode is disposed below the second carbon nanotube film and in the middle region of the second carbon nanotube film, wherein the first end electrode is parallel to the second end electrode, wherein the upper electrode is parallel to the lower electrode, wherein the carbon nanotube film is parallel to the second carbon nanotube film, wherein the first and second end electrodes are perpendicular to the carbon nanotube film and the second carbon nanotube film, and wherein the upper and lower electrodes are perpendicular to the carbon nanotube film and the second carbon nanotube film.

In one aspect, the method further comprises: providing a substrate prior to providing the carbon nanotube film. In a further aspect, the substrate is disposed below the carbon nanotube film, wherein the operation of providing the first end electrode comprises providing a lower first end electrode in the substrate, prior to the operation of providing the carbon nanotube film, wherein the operation of providing the first end electrode comprises providing an upper first end electrode above the substrate, after the operation of providing the carbon nanotube film, wherein the upper first end electrode and the lower first end electrode are connected, wherein the operation of providing the second end electrode comprises providing a lower second end electrode in the substrate, prior to the operation of providing the carbon nanotube film or concurrently with the operation of providing the lower first end electrode.

In a further aspect, the operation of providing the second end electrode comprises providing an upper second end electrode above the substrate, after the operation of providing the carbon nanotube film or concurrently with the operation of providing the upper first end electrode, wherein the upper second end electrode and the lower second end electrode are connected, wherein the operation of providing the substrate comprises providing a lower dielectric layer, wherein the lower dielectric layer is disposed below the carbon nanotube film, between the lower first end electrode and the lower electrode, and between the lower second end electrode and the lower electrode, and wherein the lower electrode is disposed within the substrate.

In one aspect of the method, at least a portion of the upper first end electrode is disposed on an upper surface of the carbon nanotube film and is connected to the carbon nanotube film, wherein at least a portion of the upper second end electrode is disposed on the upper surface of the carbon nanotube film and is connected to the carbon nanotube film, wherein at least a portion of the lower first end electrode is disposed below a lower surface of the carbon nanotube film and is connected to the carbon nanotube film, wherein at least a portion of the lower second end electrode is disposed below the lower surface of the carbon nanotube film and is connected to the carbon nanotube film, wherein the first end electrode is physically separated from the second end electrode, wherein the upper electrode is physically separated from the lower electrode, wherein the first end electrode and the second end electrode are physically separated from the upper electrode and the lower electrode, wherein the upper electrode is connected to the upper surface of the carbon nanotube film, and wherein the lower electrode is connected to the lower surface of the carbon nanotube film.

In one aspect of the method, the method further comprises: providing an upper dielectric layer above the carbon nanotube film and below the upper electrode; providing a conductive via within the upper dielectric layer, the conductive via connected to the upper electrode and to the carbon nanotube film; and providing a substrate prior to providing the carbon nanotube film.

In a further aspect, the substrate is disposed below the carbon nanotube film, wherein the operation of providing the first end electrode comprises providing a lower first end electrode in the substrate, prior to the operation of providing the carbon nanotube film, wherein the operation of providing the first end electrode comprises providing an upper first end electrode above the substrate, after the operation of providing the carbon nanotube film, wherein the upper first end electrode and the lower first end electrode are connected, wherein the operation of providing the second end electrode comprises providing a lower second end electrode in the substrate, prior to the operation of providing the carbon nanotube film or concurrently with the operation of providing the lower first end electrode, wherein the operation of providing the second end electrode comprises providing an upper second end electrode above the substrate, after the operation of providing the carbon nanotube film or concurrently with the operation of providing the upper first end electrode, wherein the upper second end electrode and the lower second end electrode are connected, wherein the operation of providing the substrate comprises providing a lower dielectric layer.

In a further aspect, the lower dielectric layer is disposed below the carbon nanotube film, between the lower first end electrode and the lower electrode, and between the lower second end electrode and the lower electrode, wherein the lower electrode is disposed within the substrate, wherein at least a portion of the upper first end electrode is disposed on an upper surface of the carbon nanotube film and is connected to the carbon nanotube film, wherein at least a portion of the upper second end electrode is disposed on the upper surface of the carbon nanotube film and is connected to the carbon nanotube film, wherein at least a portion of the lower first end electrode is disposed below a lower surface of the carbon nanotube film and is connected to the carbon nanotube film, wherein at least a portion of the lower second end electrode is disposed below the lower surface of the carbon nanotube film and is connected to the carbon nanotube film, wherein the first end electrode is physically separated from the second end electrode, wherein the upper electrode is physically separated from the lower electrode.

In a further aspect, the first end electrode and the second end electrode are physically separated from the upper electrode and the lower electrode, wherein the upper electrode is connected to the upper surface of the carbon nanotube film through the conductive via, wherein the lower electrode is connected to the lower surface of the carbon nanotube film, wherein an upper surface of the upper dielectric layer is connected to a lower surface of the upper electrode, wherein a lower surface of the upper dielectric layer is connected to the upper surface of the carbon nanotube film, wherein a first edge of the upper dielectric layer is connected to a side of the upper first end electrode, wherein a second edge of the upper dielectric layer is connected to a side of the upper second end electrode, wherein an upper surface of the conductive via is connected to the lower surface of the upper electrode, and wherein a lower surface of the conductive via is connected to the upper surface of the carbon nanotube film.

In one aspect of the method, the operation of providing the carbon nanotube film is performed after the operation of providing the lower electrode, wherein the operation of providing the first end electrode and the operation of providing the second end electrode are performed concurrently, wherein the operation of providing the upper electrode is performed after the operation of providing the carbon nanotube film.

In one aspect of the method, the method further comprises: providing a substrate prior to providing the carbon nanotube film, wherein the substrate is disposed below the carbon nanotube film, wherein the operation of providing the first end electrode comprises providing a lower first end electrode in the substrate, prior to the operation of providing the carbon nanotube film, wherein the operation of providing the first end electrode comprises providing an upper first end electrode above the substrate, after the operation of providing the carbon nanotube film, wherein the upper first end electrode and the lower first end electrode are connected, wherein the operation of providing the second end electrode comprises providing a lower second end electrode in the substrate, prior to the operation of providing the carbon nanotube film and concurrently with the operation of providing the lower first end electrode, In a further aspect, the operation of providing the second end electrode comprises providing an upper second end electrode above the substrate, after the operation of providing the carbon nanotube film and concurrently with the operation of providing the upper first end electrode, wherein the upper second end electrode and the lower second end electrode are connected, wherein the lower electrode is disposed within the substrate, wherein the operation of providing the lower electrode is performed concurrently with the operations of providing the lower first end electrode and providing the lower second end electrode.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
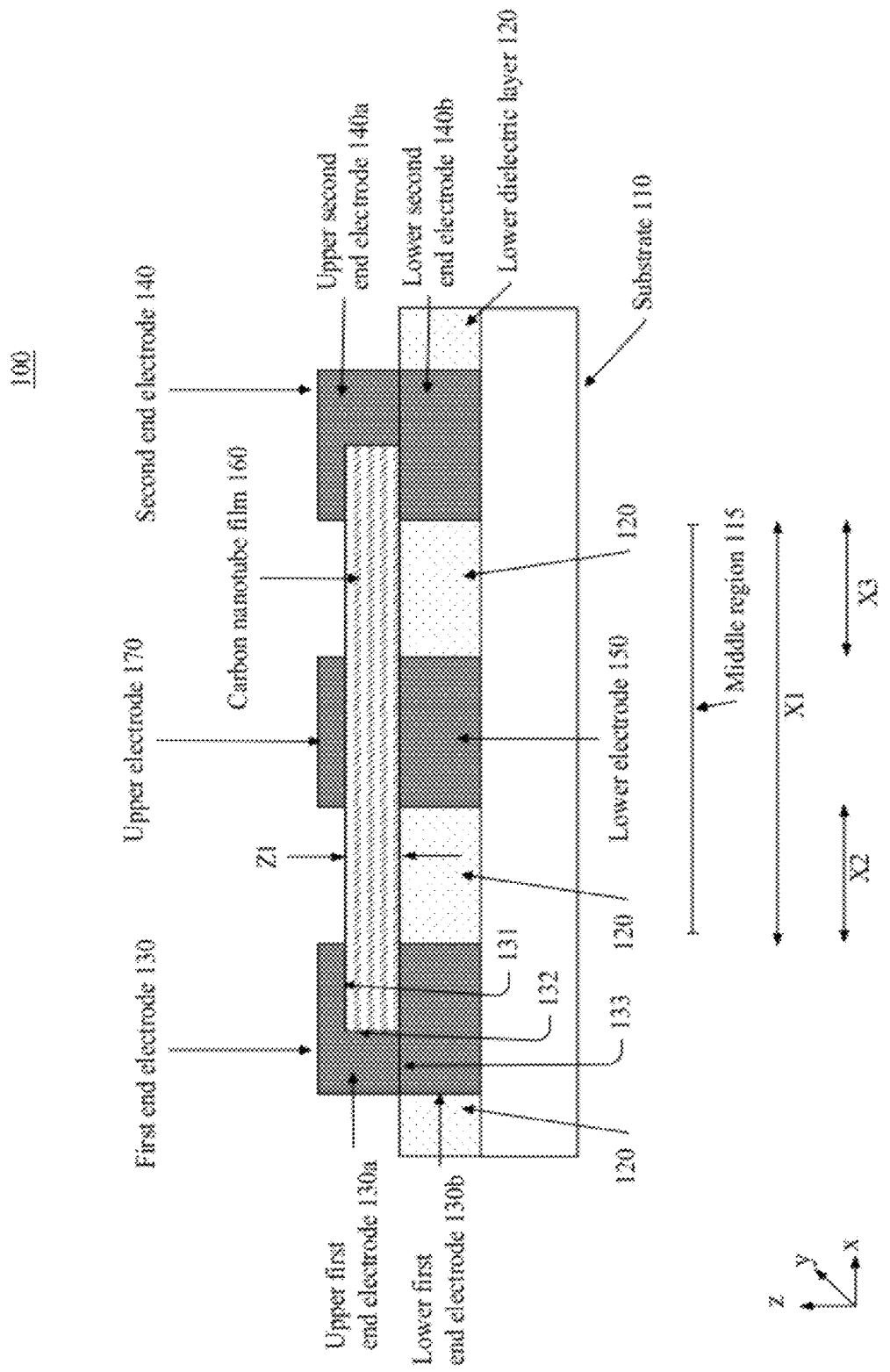
FIG. 1 illustrates a cross-sectional view of an example of a carbon nanotube (CNT) capacitor utilized as a MIMCAP device.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In one aspect, the subject technology generally relates to metal-insulator-metal capacitors (MIMCAPs), and more particularly, to MIMCAPs having insulating dielectric films comprising carbon nanotubes. In one aspect, the subject technology relates to methods for building high-density, low-leakage on-chip MIMCAPs using insulating carbon nanotubes.

In one aspect, an MIMCAP device has insulating carbon nanotubes (CNTs) or a randomly arranged carbon nanotube network in the insulating dielectric layer of the MIMCAP. In one aspect, the subject technology provides a method of making a MIMCAP device that includes patterning a lower metallization on a substrate, depositing and patterning carbon nanotubes on the lower metallization, patterning an upper metallization, and rendering the carbon nanotubes insulating by providing a short voltage pulse.

In one aspect, an MIMCAP device utilizes carbon nanotubes as an insulating layer. Applying a voltage to carbon nanotubes (CNTs) can switch the CNTs off but allow the CNTs to retain the physical characteristics. It effectively increases the capacitance without allowing any current to leak through the insulating layer.

In one aspect, the subject technology relates to a MIMCAP device and method of making the same using a carbon nanotube film as an insulating layer, separating the two conducting terminals of the MIMCAP structure.

During device scaling of MIMCAP structures, dielectric thicknesses of ultra-thin dimensions (greater than 500 Å) using silicon dioxide was determined to be useful. In addition to adjusting the dimension of oxide thickness, new material deposition techniques of high dielectric (high-k) constant materials were developed to decrease equivalent insulator thickness, thereby increasing effective capacitance, which increases capacitance for a given actual insulator thickness. The effect of using a high-k dielectric is that it allows for device integration with a thicker insulator. The linear relationship between dielectric constant (k) and insulator thickness ($t_{ins}$) is shown in Equation (1):

$$C = k\varepsilon_0 A / t_{ins} \quad (1)$$

When a higher dielectric constant material is used, the insulator thickness can be increased proportionally resulting in the same capacitance. This thicker insulator reduces the amount of leakage between the capacitor terminals, and simplifies insulator process integration. With new circuit requirements for performance requiring higher speed and lower leakage, however, these materials and processes will reach a fundamental limit. The predominant driver of this limit is material compatibility with current complementary metal-oxide semiconductor (CMOS) technology. Commonly used high-k materials such as $HfO_2$, $ZrO_2$, and $TiO_2$, while exhibiting high dielectric constants, do not have the same lattice compatibility with silicon. Due to mismatches in the lattice structure, and the requirement of ultra-thin dielectric films, leakage is exacerbated, and any advantage of going to high dielectric constant materials is lost due to excessive capacitor leakage.

FIG. 1 illustrates a cross-sectional view of an example of a carbon nanotube (CNT) capacitor. A CNT capacitor 100 may comprise a carbon nanotube (CNT) film 160 disposed between an upper electrode 170 and a lower electrode 150. The CNT capacitor 100 may further include a first end electrode 130 and a second end electrode 140 at each end of the carbon nanotube film 160. The first end electrode 130 may preferably include an upper first end electrode 130a and a lower first end electrode 130b. The second end electrode 140 may preferably include an upper second end electrode 140a and a lower second end electrode 140b. The CNT capacitor 100 may further include a lower dielectric layer 120 and a substrate 110.

In one aspect, the upper electrode 170 may be referred to as an anode or a cathode of a capacitor, and the lower electrode 150 may be referred to as a cathode or an anode of a capacitor. If the upper electrode 170 is an anode, the lower electrode 150 may be a cathode, and if the upper electrode 170 is a cathode, the lower electrode 150 may be an anode.

In one aspect, the upper and lower electrodes 170 and 150 are conductive elements and may be disposed in a middle region 115 of the CNT film 160. In one aspect, the middle region 115 is a region within the two ends of the CNT film 160 in the horizontal direction (x direction). In one example, the middle region 115 is approximately a center region of the CNT film 160. In one example, the middle region 115 is located between the outer electrodes 130 and 140.

A lower surface of the upper electrode 170 is connected (or directly connected) to an upper surface of the CNT film 160, and an upper surface of the lower electrode 150 is connected (or directly connected) to a lower surface of the CNT film 160. In one aspect, the upper and lower electrodes 170 and 150 are aligned to each other along a horizontal direction (x or y direction, or x and y directions). In another aspect, the upper and lower electrodes 170 and 150 are parallel to each other and perpendicular to the CNT film 160.

In one aspect, the first end electrode 130 may be referred to as a high (HI) terminal or a low (LO) terminal, and the second end electrode 140 may be referred to as a low (LO) terminal or a high (HI) terminal. If the first end electrode 130 is a high (HI) terminal, the second end electrode 140 may be a low (LO) terminal, and if the first end electrode 130 is a low (LO) terminal, the second end electrode 140 may a high (HI) terminal. A LO terminal may be, for example, a terminal for receiving a lower voltage (as compared to a HI terminal), and a HI terminal may be, for example a terminal for receiving a higher voltage (as compared to a LO terminal).

In one aspect, the first end electrode 130 is disposed at the first end of the CNT film 160 along a horizontal direction (x direction), and the second end electrode 140 is disposed at the second end of the CNT film 160 along the horizontal direction (x direction). An intermediate lower surface 131 of the upper first end electrode 130a abuts the upper surface of the CNT film 160. A side surface 132 of the upper first end electrode 130a abuts a leftmost side surface of the CNT film 160. The lowermost surface 133 of the upper first end electrode 130a is connected to the upper surface of the lower first end electrode 130b. The upper first end electrode 130a is thus connected to the upper and side end surfaces of the CNT film 160. The upper surface of the lower first end electrode 130b is connected to the lower surface of the CNT film 160 at the leftmost region of the CNT film 160.

A similar configuration is made at the second end of the CNT film 160 with respect to the upper and lower second end electrodes 140a and 140b (except that it is made at the right side of the CNT film 160 rather than the left side).

In this configuration, each of the first and second end electrodes 130 and 140 is attached to its corresponding end of the CNT film 160 at its corresponding upper, side and lower surface of the CNT film 160.

In one aspect, the upper first end electrode 130a and the lower first end electrode 130b may be parallel to each other along the y direction. The upper and lower second end electrodes 140a and 140b may be parallel to each other along the y direction. The end electrodes 130a, 130b, 140a and 150b may be parallel to each other and parallel to the upper and lower electrodes 170 and 150 along the y direction and may be perpendicular to the CNT film 160.

In one aspect, the electrodes 130a and 130b are separated from and electrically isolated from the electrodes 140a, 140b, 170 and 150. The electrodes 140a and 140b are separated from and electrically isolated from the electrodes 170 and 150. The electrode 170 is separated from and electrically isolated from the electrode 150.

In one aspect, the electrode 130 (130a or 130b) is separated from the electrode 140 (140a or 140b) horizontally in the x direction by a distance X1. The electrode 130 (130a or 130b) is separated from the electrode 170 or 150 horizontally in the x direction by a distance X2. The electrode 140 (140a or 140b) is separated from the electrode 170 or 150 horizontally in the x direction by a distance X3. In a preferred embodiment, X2 is equal to X3. In a preferred embodiment, there is no horizontal overlap between the electrode 130 (130a or 130b) and the electrode 170 or 150, and there is no horizontal overlap between the electrode 140 (140a or 140b) and the electrode 170 or 150.

In one aspect, the width of the electrode 130a disposed above the CNT film 160 is equal to the width of the electrode 130b; the width of the electrode 140a disposed above the CNT film 160 is equal to the width of the electrode 140b; the width of the electrode 130a disposed above the CNT film 160 is equal to the width of the electrode 140a disposed above the CNT film 160; the width of the electrode 130a disposed along the side of the CNT film 160 is equal to the width of the electrode 140a disposed along the side of the CNT film 160; and the width of the electrode 130b is equal to the width of the electrode 140b. The width described in the foregoing sentence is the width in the horizontal direction (x direction).

In one aspect, the electrode 170 is separated from the electrode 150 vertically in the z direction by a separation distance Z1. In this example, the separation distance Z1 is the thickness of the CNT film 160, but in another example, the separation distance Z1 is not limited to the thickness of the CNT film 160.

In one example, the electrodes 130b, 150 and 140b have the same thickness. In another example, the electrodes 130b and 140b have the same thickness. In one example, the thickness of the upper first end electrode 130a above the CNT film 160, the thickness of the upper electrode 170, and the thickness of the upper second end electrode 140a above the CNT film 160 are the same.

In one aspect, the lower dielectric layer 120 may be disposed below the CNT film 160, and at least certain portions of the upper surface of the lower dielectric layer 120 may be attached to the lower surface of the CNT film 160. The lower dielectric layer 120 may be disposed between, and may be attached to, the side surfaces of the lower first end electrode 130b and the lower electrode 150. The lower dielectric layer 120 may be also disposed between, and may be attached to, the side surfaces of the lower second end electrode 140b and the lower electrode 150.

In one aspect, the substrate 110 may be disposed below the electrodes 130b, 140b and 150 and the lower dielectric layer 120. The upper surface of the substrate 110 may be attached to the lower surfaces of the electrodes 130b, 140b and 150 and the lower surface of the lower dielectric layer 120.

In one aspect, the upper surfaces of the electrodes 130 (130a), 170 and 140 (140a) may be planar on an x-y plane. In one aspect, the upper surfaces of the electrodes 130b, 150 and 140b and the upper surface of the lower dielectric layer 120 may be planar on an x-y plane.

In one aspect, the CNT capacitor 100 is a four terminal device, where the four terminals include the first end electrode 130 (130a and 130b), the second end electrode 140 (140a and 140b), the upper electrode 170, and the lower electrode 150. Two outer terminals 130 and 140 can be used to electrically manipulate the state of the CNT film from conducting to insulating.

In operation, a voltage (e.g., a short voltage pulse) may be applied between the first and second end electrodes 130 and 140 to switch the CNT film 160 from a conductive state (e.g., a low resistance film that allows current to flow between the two electrodes 130 and 140) to a non-conductive state (e.g., a high resistance or insulating film that does not allow current to flow between the two electrodes 130 and 140). In another operation, a voltage (e.g., a short voltage pulse) may be applied between the first and second end electrodes 130 and 140 to switch the CNT film 160 from a non-conductive state to a conductive state. In one example, to transform a CNT film 160 from a conductive state to a non-conductive state, a voltage having amplitude greater than 12 V (e.g., 13 V) with a pulse width of 50 nanoseconds (ns) may be applied. In another example, to transform a CNT film 160 from a non-conductive state to a conductive state, a voltage having amplitude greater than 3.3 V (e.g., 4 V) with a pulse width of 10 microseconds (μs) may be applied. These are simply examples, and the subject technology is not limited to these examples.

When the CNT film 160 is in a non-conductive state (i.e., transformed into an insulating layer), the upper and lower electrodes 170 and 150 may be used as an anode and a cathode of a capacitor respectively (or vice versa), and a voltage may be applied across the upper and lower electrodes 170 and 150 to store charge or discharge charges in the capacitor 100. In one example, to store charge, a voltage having amplitude of 3 V with a pulse width of 10 μs may be applied. In another example, to discharge charges, a voltage having amplitude of 5 V with a pulse width of 50 ns may be applied. These are simply examples, and the subject technology is not limited to this example.

In one aspect, it is preferable to use four terminals for a CNT capacitor: (i) two terminals 130 and 140 disposed at two horizontal ends of the CNT film 160 to apply a voltage to switch the CNT film 160 from a conductive state to a non-conductive state and (ii) two terminals 170 and 150 (that are different from the terminals 130 and 140) disposed in the middle region 115 and connected to the upper surface of the CNT film 160 and the lower surface of the CNT film 160, respectively, to apply a voltage to store charge or to discharge charges in the CNT capacitor.

Figure 2A:
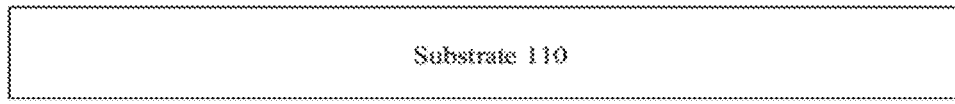
FIGS. 2A through 2G illustrate an example of a method of constructing a CNT capacitor utilizing insulating carbon nanotubes.
Figure 2B:
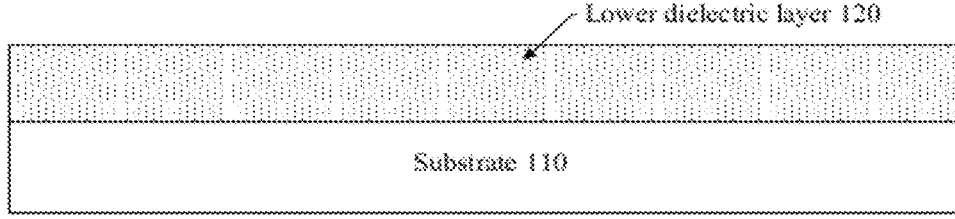
Figure 2C:
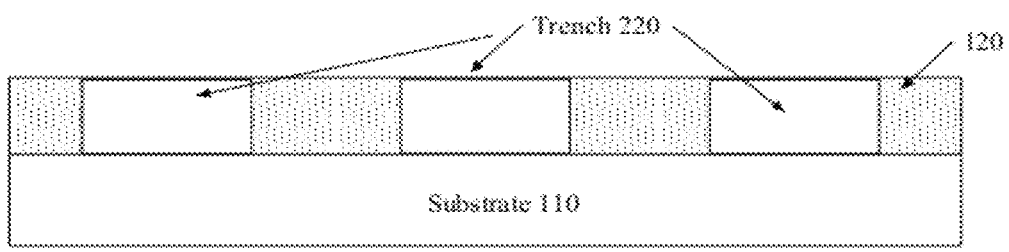

FIGS. 2A through 2G illustrate an example of a method of constructing a MIMCAP device utilizing a carbon nanotube capacitor. An operation at FIG. 2A provides a substrate 110 (e.g., an insulator or a semiconducting silicon substrate). An operation at FIG. 2B deposits or grows a lower dielectric layer 120 (e.g., a thick insulating material) directly on the substrate 110. An operation at FIG. 2C forms trenches 220 in selected regions of the lower dielectric layer 120 from the top to bottom of the lower dielectric layer 120. An operation at FIG. 2D forms lower metallization including a lower first end electrode 130b, a lower electrode 150 and a lower second end electrode 140b selectively in the trenches 220.

Figure 2D:
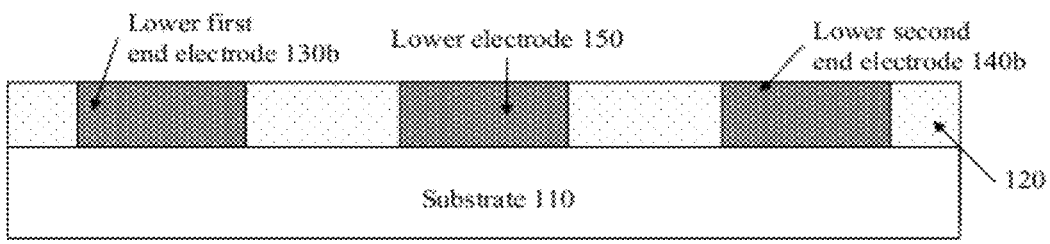

Various methods may be utilized to form the selective lower metallization (e.g., 130b, 150 and 140b) shown in FIG. 2D. One method is a damascene method where trenches 220 are first etched into the lower dielectric layer 120, and metal is deposited by chemical vapor deposition and is subsequently planarized using chemical-mechanical planarization (CMP), which is sometimes referred to as chemical-mechanical polishing, exposing the metal contacts (i.e., the lower first end electrode 130b, the lower electrode 150 and the lower second end electrode 140b).

According to another method, the lower metallization (e.g., 130b, 150 and 140b) shown in FIG. 2D may be formed by a metal first method, where metal is deposited and patterned forming electrodes 130b, 150 and 140b, and is subsequently back-filled with a conformal insulator 120 and polished selectively to the metal contacts. Both methods for forming the lower metallization result in the cross section shown in FIG. 2D. The electrodes 130b and 140b may form LO and HI terminals, respectively (or vice versa), and the lower electrode 150 may form a lower plate of an MIMCAP.

Figure 2E:
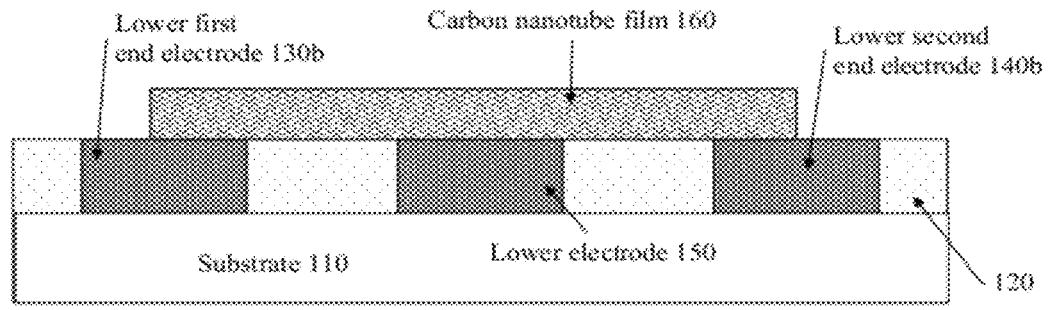

An operation of FIG. 2E deposits and patterns selectively a CNT film 160 directly on certain portions of the upper surfaces of the electrodes 130b, 150 and 140b and on certain portions of the upper surface of the lower dielectric layer 120. As deposited and patterned, the CNT film 160 may be conductive.

Figure 2F:
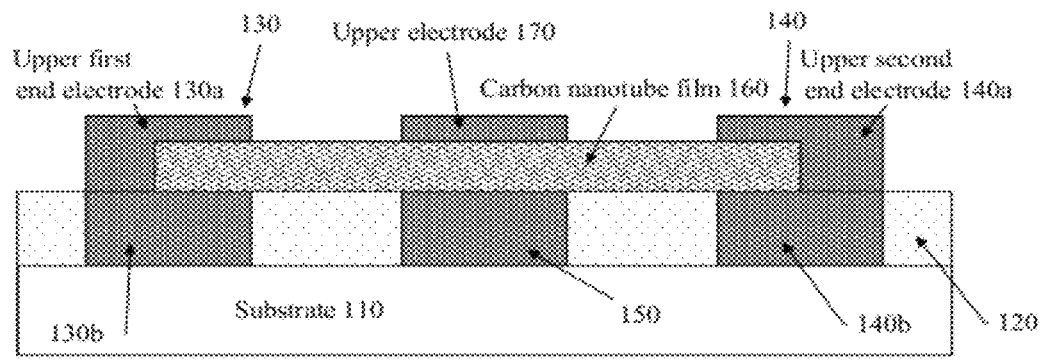

Referring to FIG. 2F, for the selective upper metallization (e.g., the electrodes 130a, 170 and 140a), metal is deposited and etched selective to the CNT film 160. The result is a device that is addressable by four terminals. In one preferred example, the electrodes 130a, 170 and 140a are deposited and patterned simultaneously. In another example, the electrodes 130a and 140a are deposited and patterned first and then the electrode 170 is deposited and patterned next. Two of the terminals (e.g., outer terminals 130 and 140) may be used to change the state of the CNT film 160 from conductive to insulating resulting in very low (e.g., down to 1 pA) leakage across capacitor terminals (e.g., the electrodes 170 and 150). When the CNT film 160 acts as an insulator, its resistance may be, for example, greater than 1 giga ohms.

Figure 2G:
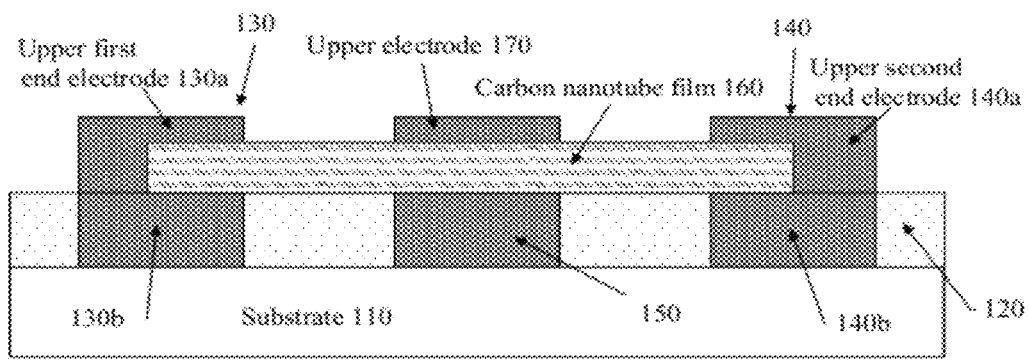
Figure 2G:

Referring to FIG. 2G, when a voltage (e.g., a short voltage pulse) is applied to the CNT film 160 across the outer electrodes 130 and 140, the CNT film is transformed from an electrically conductive material to an electrically insulating material (i.e., switching off the CNT film 160), and the CNT film 160 may then be used as an insulator in an MIMCAP device.

In one aspect, the upper and lower center electrodes 170 and 150 are used as the capacitor terminals, where the CNT film 160 is the insulator between these two terminals 170 and 150. The upper and lower center electrodes 170 and 150 may be used as upper and lower plates of an MIMCAP.

Figure 3:
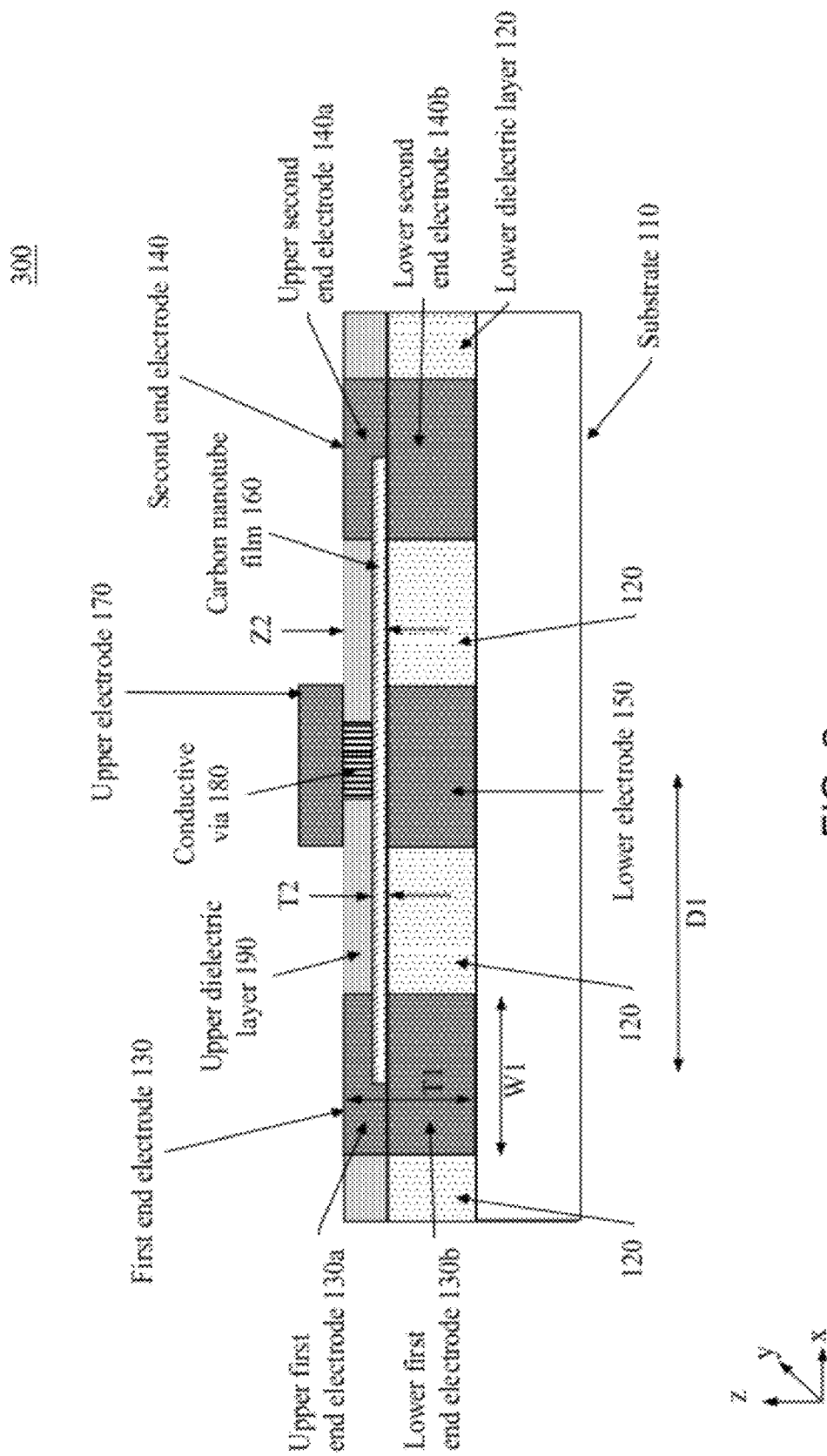
FIG. 3 illustrates a cross-sectional view of another example of a carbon nanotube (CNT) capacitor or an arrayed CNT capacitor.

FIG. 3 illustrates a cross-sectional view of another example of a carbon nanotube (CNT) capacitor. A CNT capacitor 300 in FIG. 3 is the same as the CNT capacitor 100 shown in FIG.

1, except that the CNT capacitor 300 includes an upper dielectric layer 190 (e.g., an insulator) and a conductive via(s) 180. In one aspect, a CNT capacitor 300 is a preferred embodiment over a CNT capacitor 100 because the upper dielectric layer 190 can passivate and cover all of the CNT film(s) 160.

A conductive via 180 may be formed through the upper dielectric layer 190 and may connect the upper electrode 170 to CNT film 160. In other words, an upper surface of the conductive via 180 may be in direct contact with a lower surface of the upper electrode 170, and a lower surface of the conductive via 180 may be in direct contact with an upper surface of the CNT film 160.

Portions of an upper surface of the upper dielectric layer 190 may be directly attached to a lower surface of the upper electrode 170. Portions of a lower surface of the upper dielectric layer 190 may be directly attached to an upper surface of a CNT film 160. The upper dielectric layer 190 may be disposed between the upper first end electrode 130a and the upper second end electrode 140a in the horizontal directions (x and y directions). The upper dielectric layer 190 may also be disposed in a region outside the upper first end electrode 130a (e.g., to the left of the electrode 130a) and in a region outside the upper second end electrode 140a (e.g., to the right of the electrode 140a) in the horizontal directions (x and y directions).

In the example shown in FIG. 3, a minimum thickness (T1) of an electrode 130 or 140 may be about 20 nm to ensure good conduction. A minimum width (W1) of an electrode 130 (130a or 130b), 140 (140a or 140b), 170 or 150 may be about 100 nm, but this dimension is not critical to operation. A minimum electrode pitch (D1) between electrodes (e.g., a pitch between electrodes 130 and 170 or a pitch between electrodes 170 and 140) may be about 64 nm. The thickness (T2) of a CNT film 160 may be about 1 nm to about 1 µm. These are examples and do not limit the subject technology. The subject technology may utilize other dimensions.

In one example, the electrodes 130b, 150 and 140b have the same thickness. In one example, the regions of the electrodes 130a and 140a disposed above the electrodes 130b and 140b, respectively, have the same thickness. In one example, the regions of the electrodes 130a and 140a disposed above the CNT film 160 have the same thickness.

Figure 4:
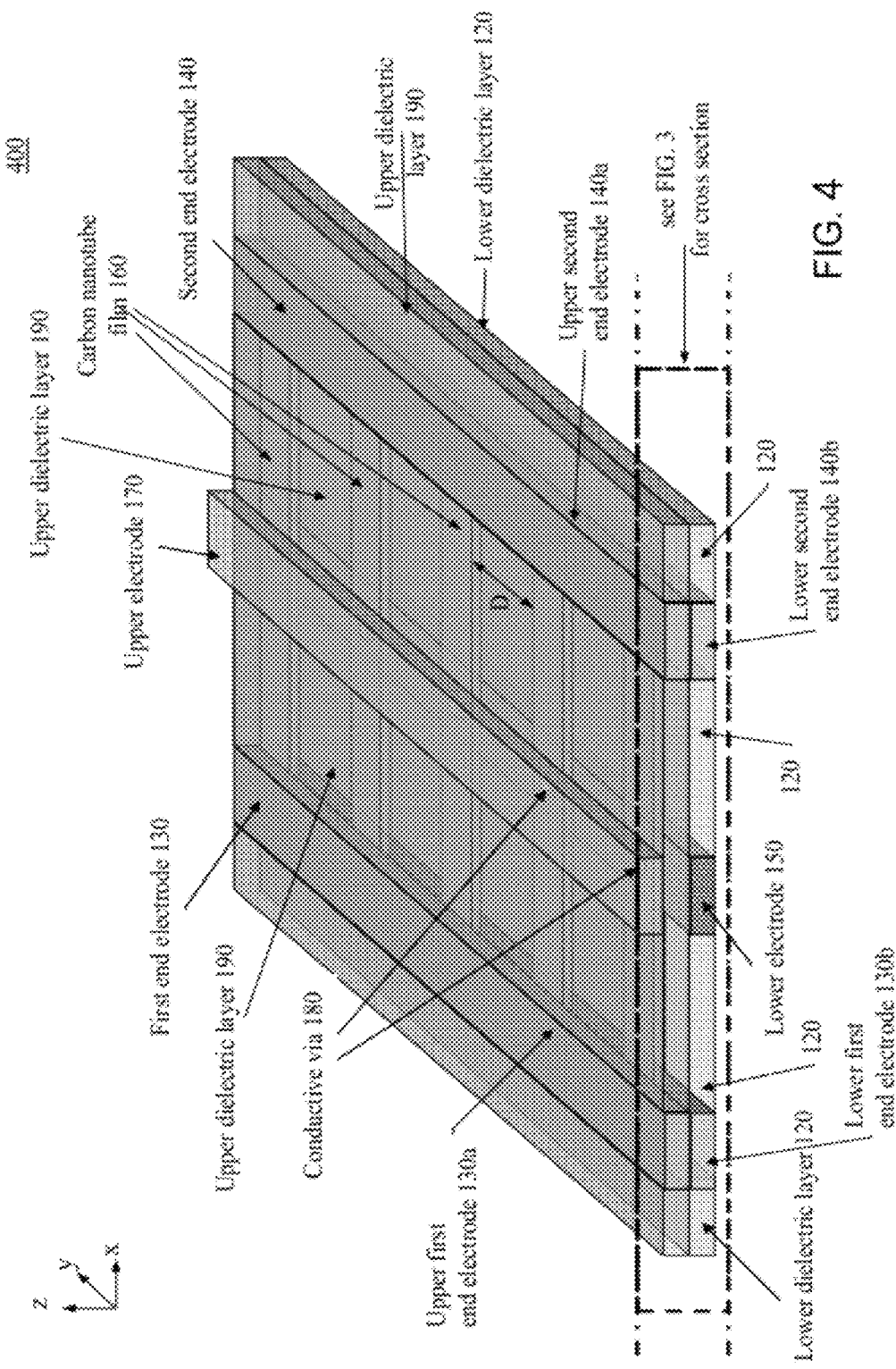
FIG. 4 illustrates a view of an example of an arrayed CNT capacitor.

As shown in FIG. 4, an MIMCAP device can be formed of an arrayed capacitor 400 having multiple CNT films. The cross section shown in FIG. 3 can be a cross-sectional view of the arrayed capacitor 400. As shown in FIG. 4, multiple CNT films 160 may be disposed (directly) on the electrodes 130b, 150 and 140b and on the lower dielectric layer 120. These multiple CNT films 160 may be parallel to each other.

In this example, five CNT films 160, one first end electrode 130, one second end electrode 140, one upper electrode 170 and one lower electrode 150 are shown, but the subject technology is not limited to this example, and the subject technology may include a larger number or a smaller number of these components. The spacing D between CNT films 160 may be, for example, 32 nm, but this may depend on the processing technology, and the subject technology is not limited to this dimension.

As shown in FIG. 4, the upper dielectric layer 190 may be disposed (directly) on the CNT films 160 and on portions of the lower dielectric layer 120 that are not covered by the CNT films 160 or the electrodes 130a and 140a. The upper dielectric layer 190 is not disposed in the areas filled with the conductive vias 180. In one aspect, the upper dielectric layer 190 may cover the (entire) upper surfaces of the CNT films 160 but not the areas of the CNT films 160 covered or filled by the conductive vias 180 or the electrodes 130a or 140a. In one aspect, the upper dielectric layer 190 may also cover the (entire) upper surface of the lower dielectric layer 120 but not the areas of the lower dielectric layer 120 covered by the electrodes 130a or 130b or the conductive vias 180.

In one aspect, the electrodes 130 (130a, 130b), 140 (140a, 140b), 170 and 150 may be parallel to each other and may be perpendicular to the CNT films 160. The electrodes 130a and 130b may be attached to each other, shorted to each other electrically and aligned to each other horizontally (x and y directions, or x or y direction). The electrode 130a is disposed directly above the electrode 130b vertically (in the z direction). The electrodes 140a and 140b may be attached to each other, shorted to each other electrically and aligned to each other horizontally (x and y directions, or x or y direction). The electrode 140a is disposed directly above the electrode 140b vertically (in the z direction).

Referring to FIGS. 3 and 4, the electrodes 170 and 150 are separated from each other by a fixed distance Z2 along the z direction. In this example, the distance Z2 is the sum of the thickness of the CNT film 160 and the height of the conductive via 180 (which is the same as the thickness of the portion of the upper dielectric layer 190 on the CNT film 160). The electrodes 170 and 150 are aligned to each other horizontally (x and/or y directions).

Figure 5A:
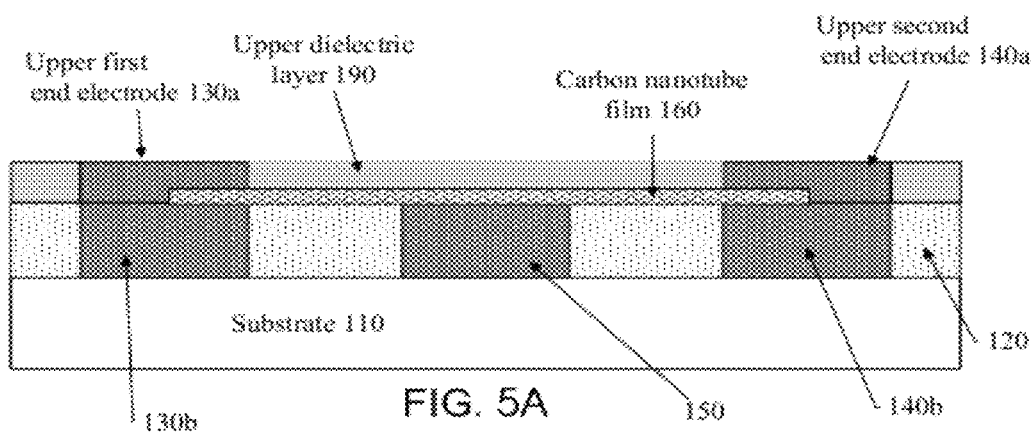
FIGS. 5A through 5C illustrate a partial flow scheme for the manufacture of a CNT capacitor shown in FIGS. 3 and 4.
Figure 5B:
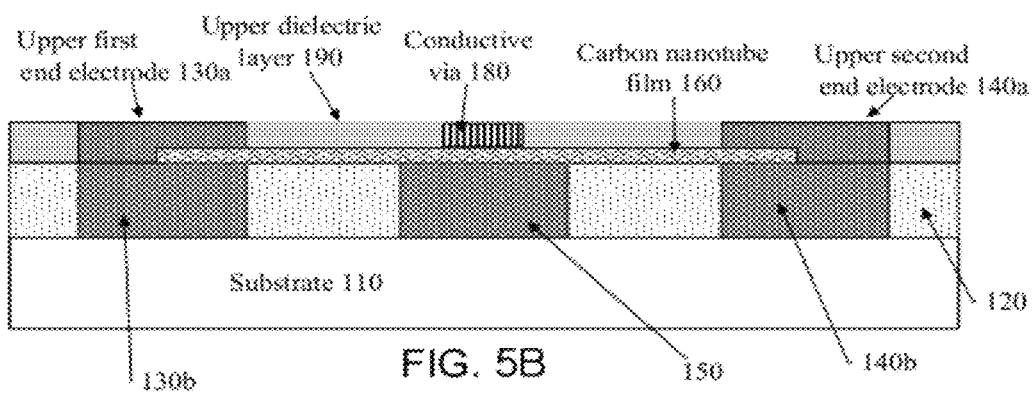
Figure 5C:
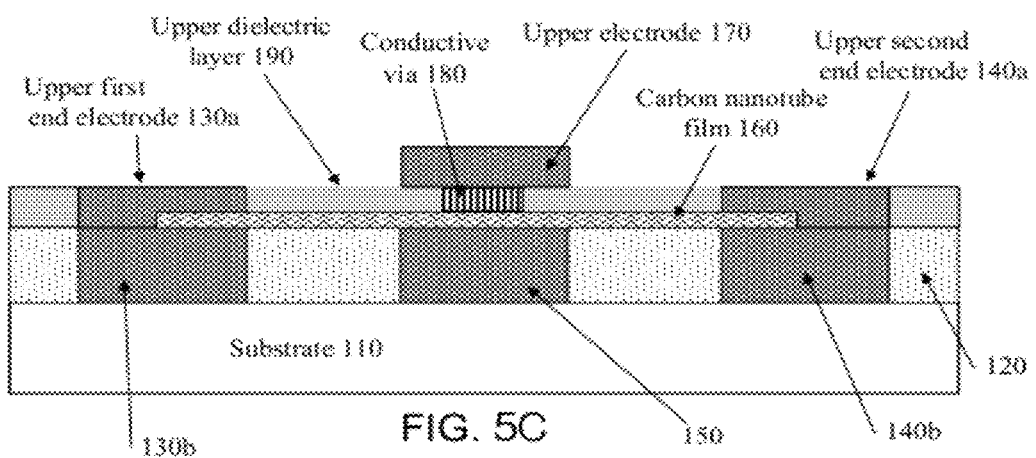

FIGS. 5A through 5C illustrate a partial flow scheme for the manufacture of a CNT capacitor shown in FIGS. 3 and 4, incorporating an example of a basic MIMCAP structure of the subject technology. The manufacturing of a CNT capacitor 300 or 400 shown FIGS. 3 and 4 may begin with the operations shown in FIGS. 2A through 2E (e.g., the operation of patterning lower electrode contacts (lower LO and HI terminals 130b and 140b (or lower HI and LO terminals 130b and 140b), and lower capacitor electrode 150) and the operation of patterning a CNT film 160).

The manufacturing method may then be followed by the operation shown in FIG. 5A in which the upper metallization (upper LO and HI terminals 130a and 140a or upper HI and LO terminals 130a and 140a) is selectively formed (e.g., deposition and patterning of metal 130a and 140a). Still referring to FIG. 5A, the upper dielectric layer 190 may then be deposited and planarized.

The operation of FIG. 5B may include opening via holes in the selected regions of the upper dielectric layer 190. Conductive vias 180 may then be deposited and patterned to contact multiple insulating CNT films 160. The operation of FIG. 5C may form the upper metallization for the capacitor. For example, metal may be deposited and patterned selectively to form the upper electrode 170. As described above, a voltage may be applied between the outer electrodes 130 and 140 to switch the CNT films 160 from a conductive state to a non-conductive state.

Examples of materials that may be utilized with the subject technology are described below. In one aspect, the electrodes 130, 130a, 130b, 140, 140a, 140b, 170 and 150 and the conductive vias 180 are conductive elements and may be a metal(s) or metal alloy(s). Conductive elements can be made of any conductive material, and can the same or different material depending on the desired performance characteristics of a switch using the device.

In one preferred aspect, the electrodes 130b, 150 and 140b are made of the same material and made simultaneously (see, e.g., FIG. 2D). In one preferred aspect, the electrodes 130a, 170 and 140a shown in FIG. 1 are made of the same material and made simultaneously (see, e.g., FIG. 2F). In another preferred aspect, the electrodes 130a and 140a shown in FIG. 3 are made of the same material and made concurrently, and the electrode 170 is made of the same material but is made after the electrodes 130a and 140a are formed (see, e.g., FIGS. 5A through 5C).

Conductive elements can, for example, be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs (single walled, multiwalled, and/or double walled, for example), or conductive nitrides, oxides, or silicides such as RuN, RuO, TiN, TaN, CoSi$_x$ and TiSi$_x$ may be used. Other kinds of conductor, and semiconductor, materials can also be used.

A substrate 110 may be an insulator or a semiconducting material (e.g., silicon). A lower dielectric layer 120 may be an insulator, and an upper dielectric layer 190 may be an insulator. In one aspect, the substrate 110 and the dielectric layers 120 and 190 may be made of the same material. In another aspect, the substrate 110 and the dielectric layers 120 and 190 may be made of different material.

In one aspect, an insulating layer (e.g., 160) of a MIMCAP device may comprise carbon nanotubes (CNTs). A CNT may be also referred to as a nanotube. The CNTs used in a MIMCAP device can be in the form of a CNT fabric in a random or ordered array of CNTs. Methods of making CNTs, CNT fabrics and the like are known and are described in U.S. Pat. Nos. 7,566,478, 7,560,136, 7,335,395, 7,259,410, 7,115,901, 7,115,960, 6,990,009, 6,784,028, 6,835,591, 6,574,130, 6,643,165, 6,706,402, 6,919,592, 6,911,682, and 6,924,538, the contents of which are hereby incorporated by reference in their entireties. In one aspect, the CNTs used in an insulating layer may range in size from between about 10 nm to about 1 cm in length. They can be distributed into random arrays in a fabric which can have a thickness ranging from between about 1 nm to about 1 μm (e.g., 1, 2, 3, 4, 5, 6, 7, 8, 9, 10, 15, 20, 25, 30, 35, 40, 45, 50, 60, 70, 80, 90, 100 nm, 1 μm and all values in between).

In one aspect, any number of CNTs can be used in an MIMCAP insulating layer, including single CNTs. CNTs useful in an insulating layer include single-walled carbon nanotubes (SWNTs) that are conducting, insulating, or semiconducting. Insulating SWNTs can be used directly. In another aspect, conducting SWNTs, semi-conducting SWNTs, and combinations thereof, can be used in the insulating layer. In such configurations, the insulating properties are obtained by application of a short voltage pulse. This process is also described in U.S. Pat. No. 7,479,654, which is hereby incorporated by reference in its entirety. Other CNTs useful in the practice of the subject technology may include double-walled and multi-walled CNTs. Other CNTs that are useful may include double-walled (DWNTs) and multi-walled CNTs (MWNTs).

The dielectric constant contemplated for a CNT layer can be up to about 3600. K. Ahmad et al., "Electrical Conductivity and Dielectric Properties of Multiwalled Carbon Nanotube and Alumina Composites," Applied Physics Letters, 2006, pages 33122-1 through 33122-3, Vol. 89, American Institute of Physics, describes experimental evidence of a multiwall nanotube-containing composite with a dielectric constant of 3600 in a composite with 8 vol. % purified MWNT at 1 kHz. This demonstrates the potential of a CNT or CNT film to exhibit extremely high dielectric constants. In one aspect, the dielectric constant of materials useful in the practice of the subject technology may include 3600, 3500, 3400, 3300, 3200, 3100, 3000, 2900, 2800, 2700, 2500, 2000, 1500, 1000, 900, 800, 700, 600, 500, 400, 300, 200, 100, and all values in between.

A dielectric film comprising carbon nanotubes (e.g., CNT film 160) in an MIMCAP structure may exhibit: a) a low standby current to mitigate data loss or standby power consumption; b) a high effective dielectric constant; and c) mechanical stability for integration into both state-of-the-art CMOS circuitry and developmental systems such as carbon nanotube-CMOS hybrid circuitry.

The resulting structure is an MIMCAP with low leakage that is scalable to large or small dense areas because of the low leakage in the insulating carbon nanotube film. This provides a scheme that can be readily integrated into CMOS circuitry such as DRAM applications, CMOS-CNT hybrid analog technologies, or analog and digital CNT-based designs. The MIMCAP devices of the subject technology can also be used in semiconductors, in batteries and power sources, in addition to memory/data storage applications.

The CNT-based MIMCAP has advantages over its CMOS counterpart at least in two important facets. First, when a CNT film (e.g., CNT film 160) is switched off (i.e., transformed into a non-conductive state), no leakage (down to pico-ampere (pA) levels) is detected across the film. This eliminates the need for a high-k dielectric film and integration issues that come with the materials mentioned above. Second, the enhanced surface area of the carbon nanotubes increases the density of charge that can be stored using this material, thereby increasing capacitance for a given unit area. Equation (1) described above would likely no longer apply where increasing capacitance is largely driven by area. This allows for increased scalability of capacitor devices by obtaining the same capacitance using a smaller design footprint.

Figure 6:
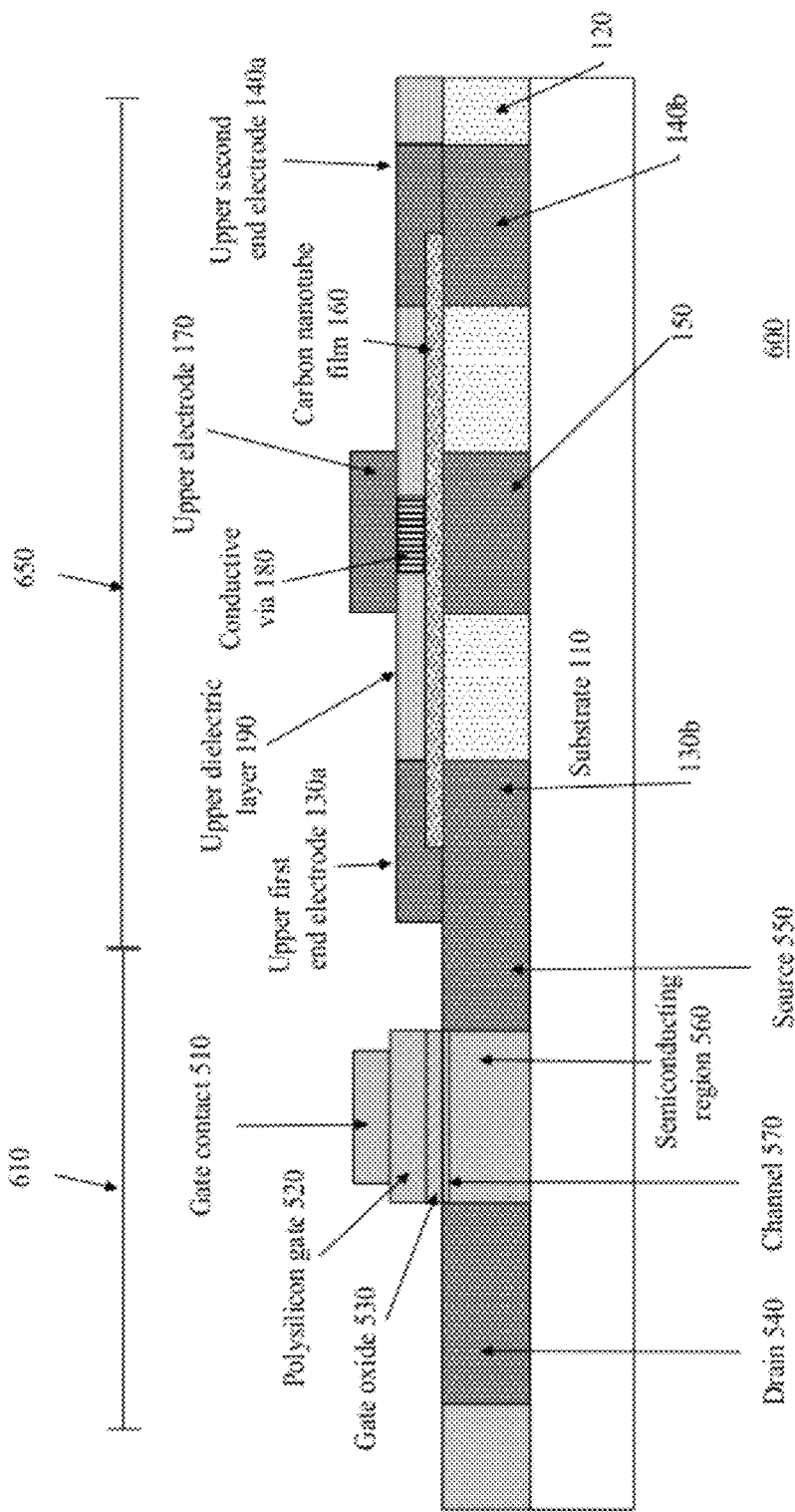
FIG. 6 illustrates an example of a CNT capacitor integrated with other circuitry.

FIG. 6 illustrates an example of a CNT capacitor integrated with circuitry (e.g., CMOS circuitry) on the same die. A single die 600 may include a transistor 610 and a CNT capacitor 650. The transistor 610 may be a metal-oxide semiconductor field-effect transistor (MOSFET). The transistor 610 may include a gate oxide 530, a polysilicon gate 520 and a gate contact 510. The transistor 610 may also include a drain 540 and a source 550. The transistor 610 may include a semiconducting region 560 in which a channel 570 may be formed under the gate oxide 530. The CNT capacitor 650 may be a CNT capacitor 300 shown in FIG. 3, a CNT capacitor 100 shown in FIG. 1 or another type of CNT capacitor. The source 550 may be the same as the lower first end electrode 130b.

In another embodiment, the drain 540 may be a source, and the source 550 may be a drain. The component 550 as a drain may be the same as the lower first end electrode 130b.

A CNT capacitor 650 may be formed after a transistor 610 is formed. Alternatively, a CNT capacitor 650 may be formed after some portions of the transistor 610 is formed (e.g., after the semiconducting region 560, the drain 540, the source 550 are formed, or after the semiconducting region 560, the drain 540, the source 550, the gate oxide, and the polysilicon gate 520 are formed). Some components of the transistor 610 and the CNT capacitor 650 may be formed simultaneously. For example, components 540, 550 (which may be 130b), 150 and 140b may be formed simultaneously. Components 510, 130a, and 140a may be formed simultaneously. Alternatively, components 510 and 170 may be formed simultaneously.

The transistor 610 and the CNT capacitor 650 may use the same material at least for some of the components. For example, components 540, 550 (which may be 130b), 150 and 140b may be made of the same material. Components 510, 130a and 140a may be made of the same material. Components 510 and 170 may be made of the same material. While only one transistor and only one CNT capacitor are shown in FIG. 6, a die 600 may include additional transistors, additional CNT capacitors and other circuitry.

Besides the configurations and methods described above, the subject technology may be practiced using different configurations and methods. For example, a first end electrode 130 may include only one of the upper first end electrode 130a and the lower first end electrode 130b (not both). A first end electrode 130 may be disposed on or below the CNT film 160 without being attached to the leftmost side surface of the CNT film 160. A second end electrode 140 may include only one of the upper second end electrode 140a and the lower second end electrode 140b (not both). A second end electrode 140 may be disposed on or below the CNT film 160 without being attached to the rightmost side surface of the CNT film 160. The first end electrode 130 may be disposed to the left of the upper electrode 170 or to the left of the lower electrode 150 without being placed at the leftmost end of the CNT film 160. The second end electrode 140 may be disposed to the right of the upper electrode 170 or to the right of lower electrode 150 without being placed at the rightmost end of the CNT film 160. In another embodiment, the upper and lower electrodes 170 and 150 are not aligned horizontally (along the x or y direction). In one preferred aspect, the phrase "end" may refer to an actual end. In another aspect, the phrase "end" may refer to a configuration or location that is simply not a center. In one aspect, the phrases "first end" and "second end" may refer to simply two distinct locations.

Figure 7:
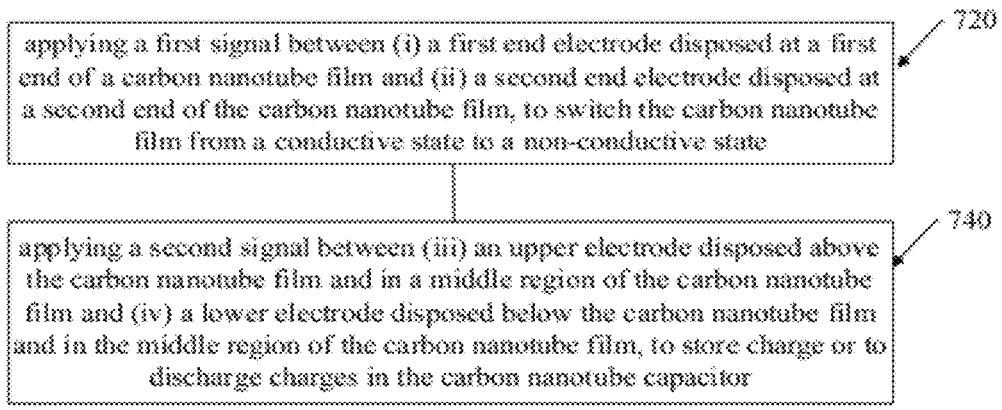
FIG. 7 illustrates an example of a method of operating a carbon nanotube capacitor.

Referring to FIG. 7, an example of a method of operating a carbon nanotube capacitor is illustrated. At operation 720, a first signal may be applied between (i) a first end electrode disposed at a first end of a carbon nanotube film and (ii) a second end electrode disposed at a second end of the carbon nanotube film, to switch the carbon nanotube film from a conductive state to a non-conductive state. At operation 740, a second signal may be applied between (iii) an upper electrode disposed above the carbon nanotube film and in a middle region of the carbon nanotube film and (iv) a lower electrode disposed below the carbon nanotube film and in the middle region of the carbon nanotube film, to store charge or to discharge charges in the carbon nanotube capacitor.

Figure 8:
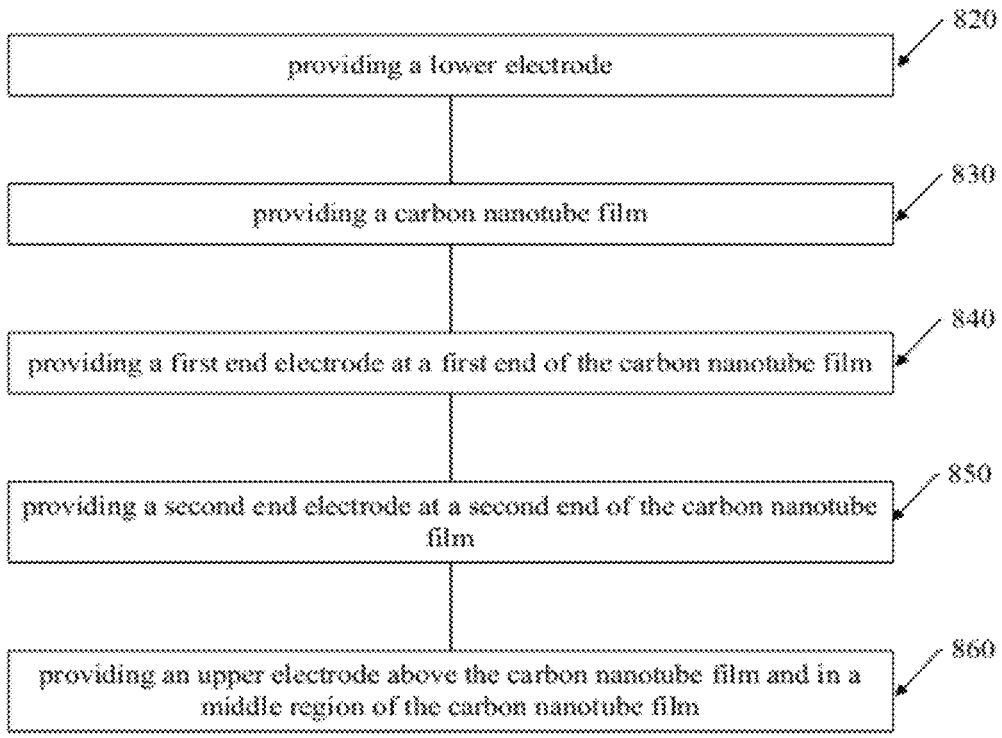
FIG. 8 illustrates an example of a method of making a carbon nanotube capacitor.

Referring to FIG. 8, an example of a method of making a carbon nanotube capacitor is illustrated. Operation 820 may include providing a lower electrode. Operation 830 may include providing a carbon nanotube film. Operation 840 may include providing a first end electrode at a first end of the carbon nanotube film. Operation 850 may include providing a second end electrode at a second end of the carbon nanotube film. Operation 860 may include providing an upper electrode above the carbon nanotube film and in a middle region of the carbon nanotube film.

Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented. The operations described in this disclosure or recited in the method claims may be performed in different orders.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

Terms such as "upper," "lower," "side," "top," "bottom," "front," "rear," "vertical," "horizontal," "x," "y," "z" and the like as used in this disclosure should be understood as referring to an arbitrary frame of reference, rather than to the ordinary gravitational frame of reference. Thus, an upper surface, a lower surface, a top surface, a bottom surface, a front surface, a rear surface, a vertical direction, a horizontal direction, an x direction, a y direction and a z direction may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A carbon nanotube capacitor, comprising:
   a carbon nanotube film;

a substrate disposed below the carbon nanotube film;

a first end electrode disposed at a first end of the carbon nanotube film, wherein the first end electrode comprises an upper first end electrode disposed above the substrate and a lower first end electrode disposed in the substrate, and wherein the upper first end electrode and the lower first end electrode are connected;

a second end electrode disposed at a second end of the carbon nanotube film, wherein the second end electrode comprises an upper second end electrode disposed above the substrate and a lower second end electrode disposed in the substrate, and wherein the upper second end electrode and the lower second end electrode are connected;

an upper electrode disposed above the carbon nanotube film and in a middle region of the carbon nanotube film; and a lower electrode disposed below the carbon nanotube film and in the middle region of the carbon nanotube film, wherein the lower electrode is disposed within the substrate, wherein the substrate comprises a lower dielectric layer disposed below the carbon nanotube film, between the lower first end electrode and the lower electrode, and between the lower second end electrode and the lower electrode, wherein the first end electrode is different from the second end electrode, the upper electrode and the lower electrode, wherein the second end electrode is different from the upper electrode and the lower electrode, wherein the upper electrode is different from the lower electrode, and wherein the carbon nanotube capacitor is a four terminal device comprising four terminals, wherein a first one of the four terminals is the first end electrode, a second one of the four terminals is the second end electrode, a third one of the four terminals is the upper electrode, and the fourth one of the four terminals is the lower electrode.

2. The carbon nanotube capacitor according to claim 1, wherein the upper electrode and the lower electrode are separated from each other by a first fixed distance vertically, aligned to each other horizontally, and extend lengthwise in a first direction, wherein the first end electrode and the second end electrode are separated from each other by a second fixed distance horizontally, aligned to each other vertically, and extend lengthwise in the first direction, and wherein the carbon nanotube film extends lengthwise horizontally in a second direction different from the first direction.

3. The carbon nanotube capacitor according to claim 1, wherein at least a portion of the upper first end electrode is disposed on an upper surface of the carbon nanotube film and is connected to the carbon nanotube film, wherein at least a portion of the upper second end electrode is disposed on the upper surface of the carbon nanotube film and is connected to the carbon nanotube film, wherein at least a portion of the lower first end electrode is disposed below a lower surface of the carbon nanotube film and is connected to the carbon nanotube film, wherein at least a portion of the lower second end electrode is disposed below the lower surface of the carbon nanotube film and is connected to the carbon nanotube film, wherein the first end electrode is physically separated from the second end electrode, wherein the upper electrode is physically separated from the lower electrode, wherein the first end electrode and the second end electrode are physically separated from the upper electrode and the lower electrode, wherein the upper electrode is connected to the upper surface of the carbon nanotube film, and wherein the lower electrode is connected to the lower surface of the carbon nanotube film.

4. The carbon nanotube capacitor according to claim 1, wherein the first end electrode and the second end electrode are configured to apply voltages to switch the carbon nanotube film from a conductive state to a non-conductive state, and wherein the upper electrode is a capacitor anode or a capacitor cathode, and the lower electrode is a capacitor cathode or a capacitor anode, and the upper electrode and the lower electrode are configured to apply voltages to store charges in the carbon nanotube capacitor.

* * * * *